(12) United States Patent
Zhang

(10) Patent No.: US 8,102,645 B2
(45) Date of Patent: Jan. 24, 2012

(54) MULTI-FUNCTIONAL SWITCH ASSEMBLY AND PORTABLE ELECTRONIC DEVICE USING THE SAME

(75) Inventor: Yu Zhang, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 45 days.

(21) Appl. No.: 12/842,140

(22) Filed: Jul. 23, 2010

(65) Prior Publication Data

US 2011/0188223 A1    Aug. 4, 2011

(30) Foreign Application Priority Data

Feb. 3, 2010    (CN) .......................... 2010 1 0301152

(51) Int. Cl.
*H05K 5/00* (2006.01)
*H05K 7/00* (2006.01)
*H04M 1/00* (2006.01)
*G11B 17/00* (2006.01)

(52) U.S. Cl. ......... 361/679.01; 361/679.02; 361/679.55; 361/679.56; 361/679.57; 361/679.58; 455/575.1; 455/575.3; 455/575.4; 455/575.8; 369/253

(58) Field of Classification Search ............. 361/679.01, 361/679.02, 679.08, 679.09, 679.3, 679.55–679.59; 455/575.1, 575.3, 575.4, 575.8; 369/282, 369/291, 253, 44.16, 75.5
See application file for complete search history.

(56) References Cited

U.S. PATENT DOCUMENTS 7,751,181 B2 *   7/2010   Chen ..................... 361/679.01
2008/0318646 A1 * 12/2008  Lin ......................... 455/575.4

* cited by examiner

*Primary Examiner* — Jayprakash N Gandhi
*Assistant Examiner* — Jerry Wu
(74) *Attorney, Agent, or Firm* — Altis Law Group, Inc.

(57) ABSTRACT

A multi-functional switch assembly and a portable electronic device are disclosed. The portable electronic device includes a housing, a cover, a switch, a base member, a driving member, a switching member, and an elastic member. The driving member is driven to switch on or off the switch, and the switching member is switched between a first state where the base member is secured to the cover, and a second state where the cover is detached from the base member. The elastic member enables the base member slidably relative to the housing between the first state and the second state.

17 Claims, 5 Drawing Sheets

US 8,102,645 B2

MULTI-FUNCTIONAL SWITCH ASSEMBLY AND PORTABLE ELECTRONIC DEVICE USING THE SAME

BACKGROUND

1. Technical Field

The present disclosure relates to switch assemblies, more particularly to a multi-functional switch assembly and a portable electronic device using the switch assembly.

2. Description of the Related Art

Portable electronic devices such as mobile phones typically include switches, such as latching switches or power switches. The latching switch can attach or detach a battery cover relative to a housing of the portable electronic device. The power switch can power on or off the portable electronic device. However, the switches are usually separately formed with the housing, causing inconvenience for single-hand switching operations.

Therefore, there is room for improvement within the art.

BRIEF DESCRIPTION OF THE DRAWINGS

Many aspects of the present multi-functional switch assembly and a portable electronic device using the switch assembly can be better understood with reference to the following drawings. The components in the drawings are not necessarily drawn to scale, the emphasis instead being placed upon clearly illustrating the principles of the present multi-functional switch assembly and the portable electronic device. Moreover, in the drawings, like reference numerals designate corresponding parts throughout the several views.

DETAILED DESCRIPTION

Figure 1:
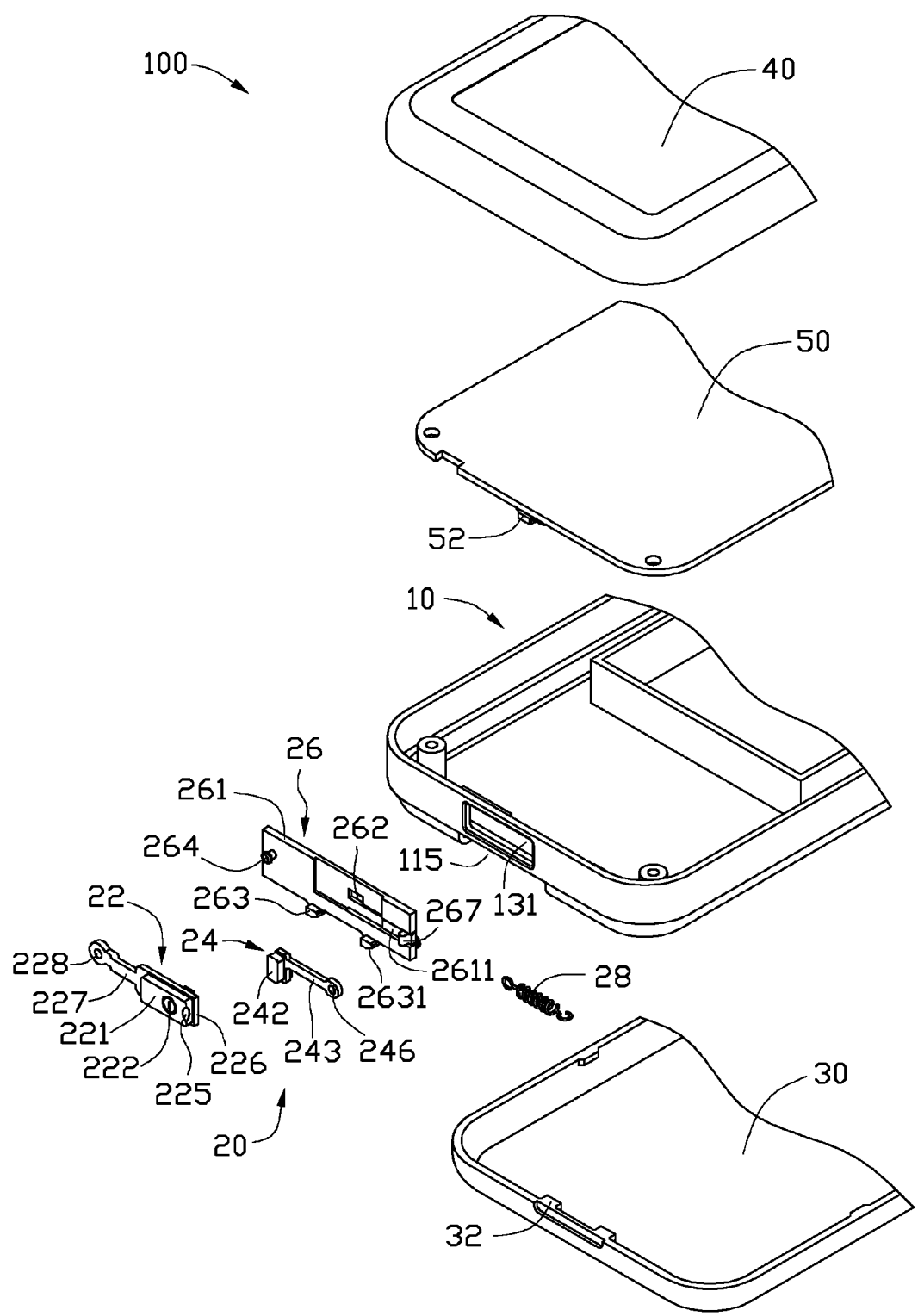
FIG. 1 is an exploded view of a switch assembly used with a portable electronic device according to an exemplary embodiment.
Figure 3:
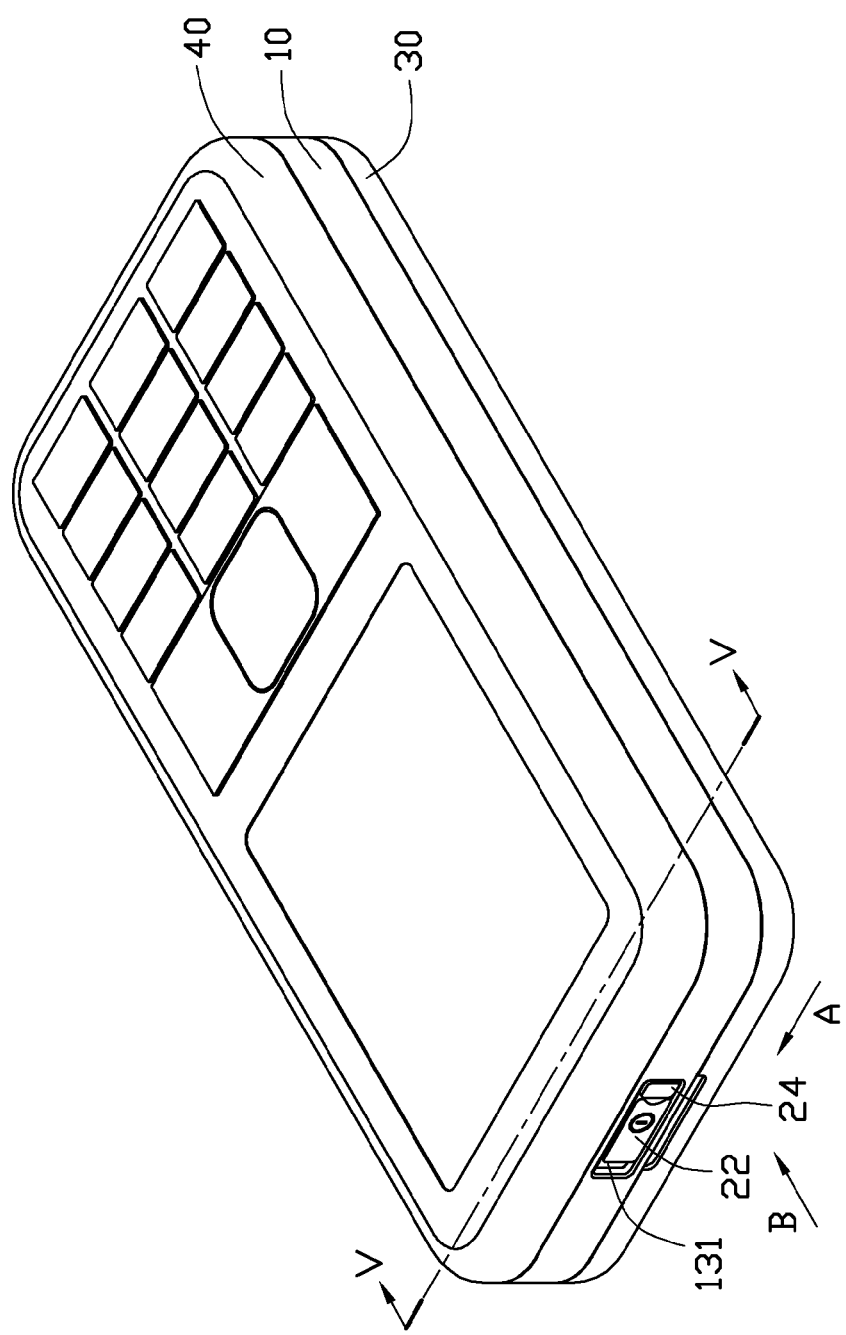
FIG. 3 is an assembled view of the portable electronic device shown in FIG. 1.

FIGS. 1 and 3 show an embodiment of a portable electronic device 100 including a housing 10, a multi-functional switch assembly 20 assembled to the housing 10, a bottom cover 30, a top cover 40 and a circuit board 50 assembled inside the housing 10. The bottom cover 30 and the top cover 40 cooperate to cover two opposite sides of the housing 10. The multi-functional switch assembly 20 can be operated either to detach the bottom cover 30 from the housing 10, or to switch the circuit board 50, such as to power on or off the portable electronic device 100.

Figure 2:
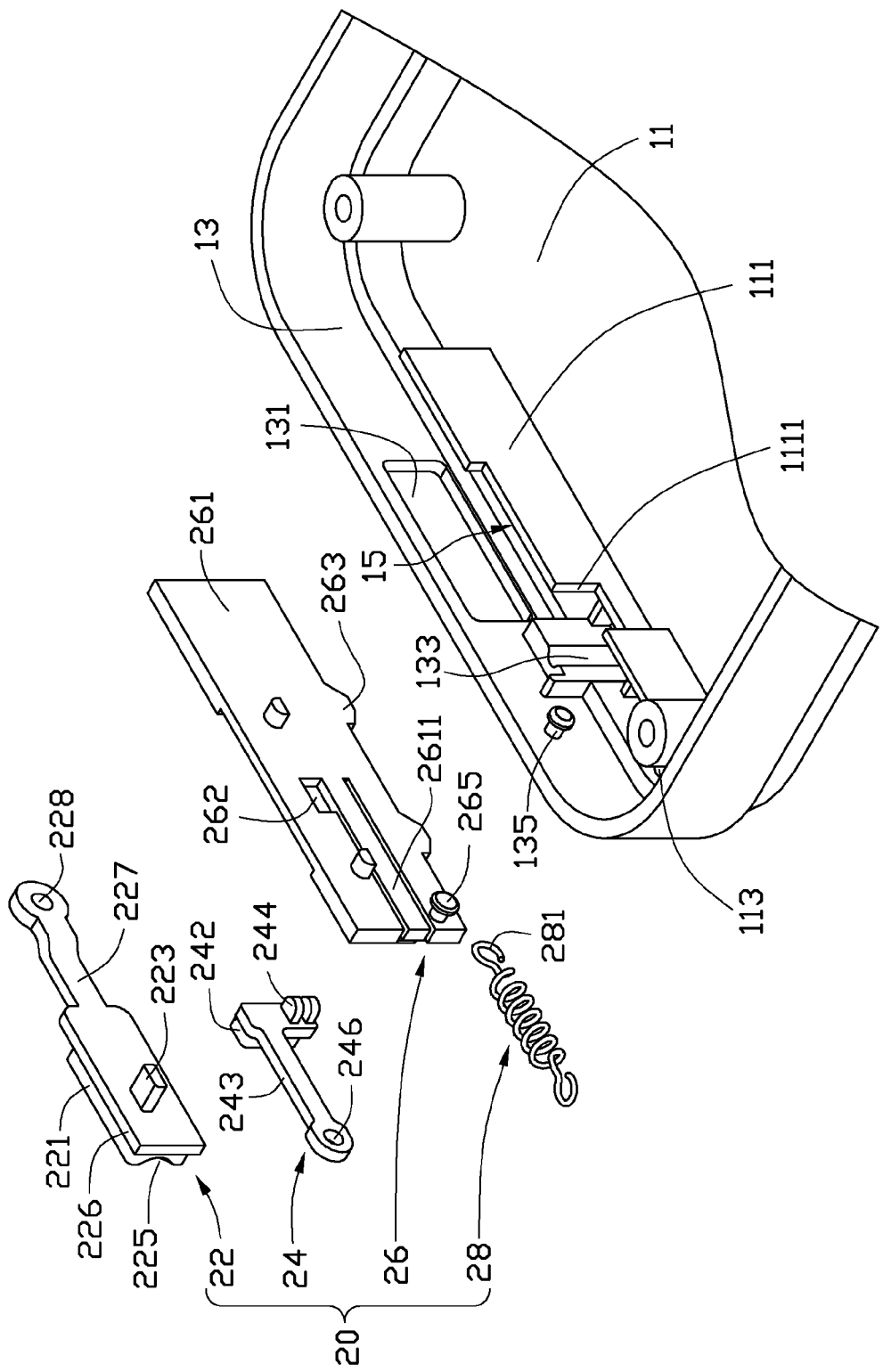
FIG. 2 is a partial enlarged view of the switch assembly shown in FIG. 1.

Referring further to FIG. 2, the housing 10 includes a bottom wall 11 and a sidewall 13. The bottom wall 11 has a resilient board 111 and a pin 113 protruding therefrom (best shown in FIG. 4). The resilient board 111 and portions of the sidewall 13 are substantially parallel with each other. The sidewall 13 and the bottom wall 11 enclose a mounting groove 15 for mounting the switch assembly 20. The resilient board 111 defines a cutout 1111 near the pin 113. The bottom wall 11 defines a through groove 115 between the sidewall 13 and the resilient board 111. The sidewall 13 includes a mounting hole 131, a latching slot 133, and a post 135. The latching slot 133 is positioned between the mounting hole 131 and the post 135. The mounting hole 131 is defined through the sidewall 13. The latching slot 133 aligns with the cutout 1111. The post 135 protrudes perpendicularly from the sidewall 13 towards the resilient board 111.

The switch assembly 20 includes a driving member 22, a switching member 24, a base member 26 and an elastic member 28. The driving member 22 is elastic including a step-shaped main body 221, a press portion 222, and a switching portion 223. The press portion 222 and the switching portion 223 are located at two opposite sides of the main body 221. The main body 221 defines a receiving slot 225, and extends a deformable arm 227 opposite to the receiving slot 225. The arm 227 defines a ring 228 at the distal end. When pressing the press portion 222, the arm 227 and the main body 221 can deform along the pressing direction. The ring 228 is used to secure the driving member 22 to the base member 26.

The switching member 24 is elastic and includes a handle portion 242, a main portion 243 and a resisting portion 244. The handle portion 242 and the resisting portion 244 are located at two opposite sides of the main portion 243. The main portion 243 has a coil portion 246 opposite to the handle portion 242 and the resisting portion 244. When pressing the handle portion 242, the main portion 243 can deform along the pressing direction. The coil portion 246 can coil around and secure the post 135, and accordingly, the switching member 24 is secured to the housing 10.

The base member 26 includes a base board 261, a through slit 262, two first hooking portions 263, a column 264, a securing portion 265 and a latching portion 267. The two first hooking portions 263, the column 264 and the latching portion 267 are located at the same side of the base member 26. The base board 261 extends an elastic bar 2611 from the interior wall of the through slit 262 to the outside. The elastic bar 2611 can be resisted by the resisting portion 244 to deform away from the base board 261. The through slit 262 is larger than the switching portion 223, and the switching portion 223 can pass through the through slit 262. The first hooking portions 263 are located at the bottom of the base board 261. Each of the first hooking portions 263 has a slanted wall 2631. The column 264 is used to secure the ring 228. Accordingly, the driving member 22 is secured to the base member 26. The securing portion 265 is adjacent to the distal end of the elastic bar 2611 for securing the elastic member 28 with the base member 26. The latching portion 267 protrudes from the distal end of the elastic bar 2611. The latching portion 267 can latch into the latching slot 133, latching the base member 26 with the housing 10.

Figure 4:
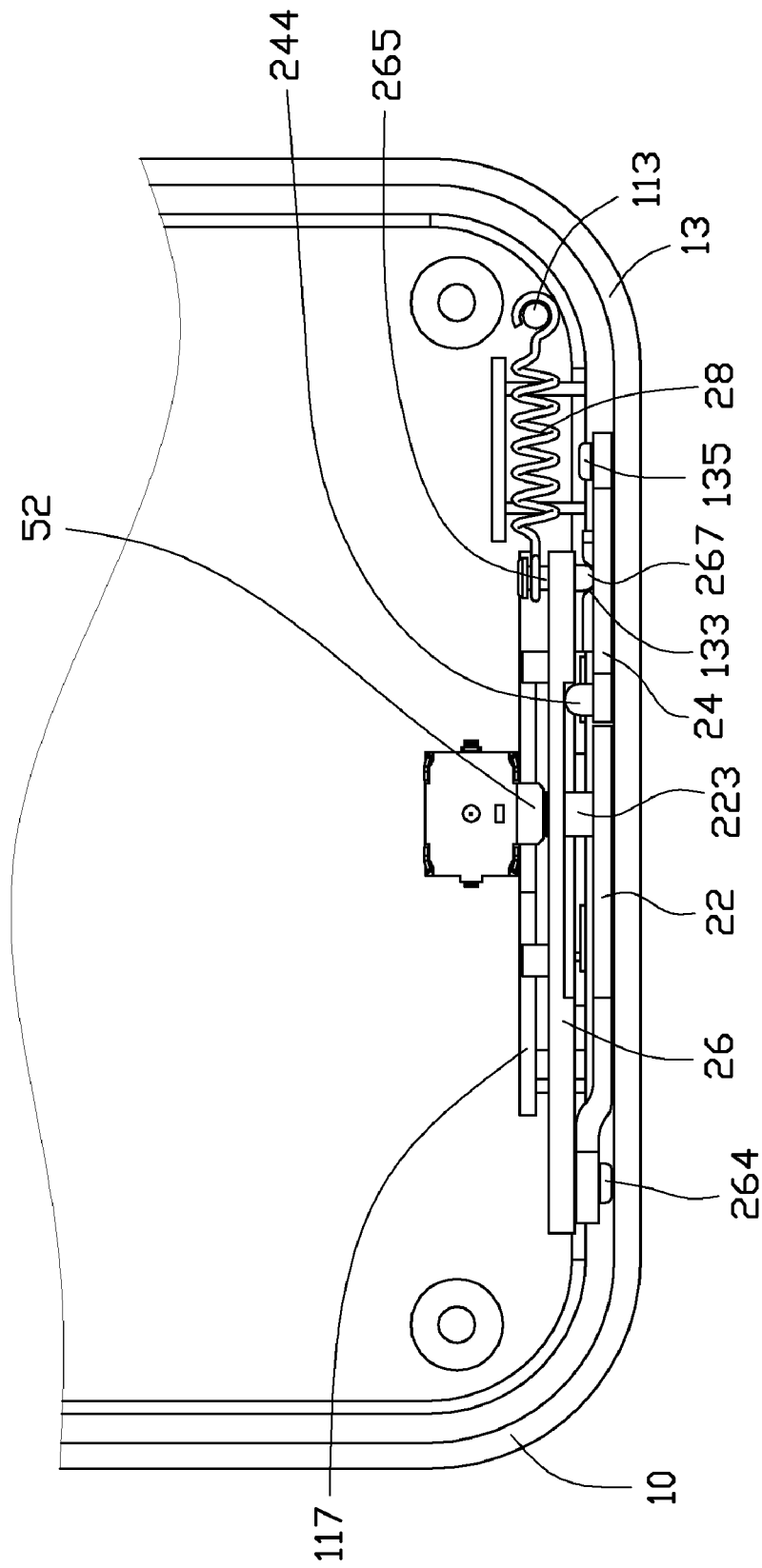
FIG. 4 is a planar view of the switch assembly shown in FIG. 1.
Figure 5:
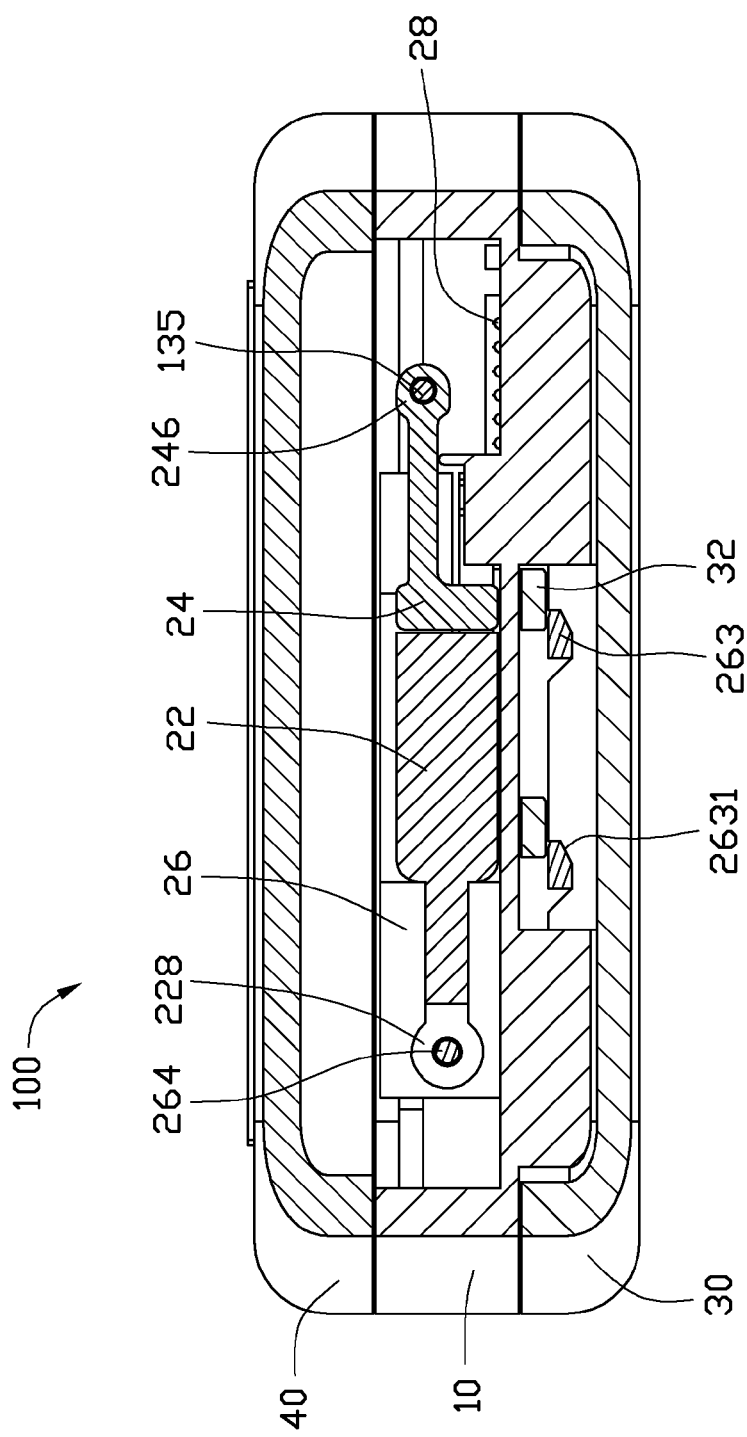
FIG. 5 is a cross sectional view of the portable electronic device shown in FIG. 3, taken along line IV-IV.

Referring further to FIGS. 4 and 5, the elastic member 28 may be a coiled spring and has two opposite ends 281 securing to the securing portion 265 and the pin 113. The bottom cover 30 includes two second hooking portions 32 hooking with the first hooking portions 263. The circuit board 50 includes a switch 52 corresponding to the switching portion 223. The switch 52 may be a power switch for the portable electronic device 100.

Referring again to FIG. 1 through FIG. 5, during assembly of the portable electronic device 100, the ring 228 secures to the column 264, and the switching portion 223 passes through the through slit 262. The switching member 24 resists against the driving member 22. The elastic member 28 is secured to the base member 26. In this case, the resisting portion 244 resists against the elastic bar 2611, and the coil portion 246 is located at the outside of the base member 26. The assembly of the switch assembly 20 is completed.

The switch assembly 20 is mounted into the mounting groove 15. The base member 26 resists against the resilient board 111, and the first hooking portions 263 exposes out of the through groove 115. The cutout 1111 receives the securing portion 265, and the latching slot 133 latches the latching portion 267. The flange of the main body 221 resists against the circumferential wall of the mounting hole 131. The main portion 243 resists against the sidewall 13. The main body 221 and the handle portion 242 are located outside the mounting hole 131 and the housing 10. The coil portion 246 secures with the post 135. The elastic member 28 is extended, securing the end 281 to the pin 113. The assembly of the switch assembly 20 within the housing 10 is completed. After that, the circuit board 50 and the top cover 40 are mounted to the housing 10, and the switching portion 223 aligns with the switch 52.

To attach the bottom cover 30 to the housing 10, press the handle portion 242 downward to swing the main portion 243 and the resisting portion 244 about the post 135 further into the housing 10. Meanwhile, the resisting portion 244 resists against and bends the elastic bar 2611 away from the base board 261, until the latch of the latching portion 267 in the latching slot 133 is released. The bottom cover 30 is pressed against the housing 10, and the second hooking portions 32 resist against and slide along the slanted walls 2631 of the first hooking portions 263. During this process, the base member 26 slides within the housing 10 along a direction A (shown in FIG. 3) and the elastic member 28 extends to accumulate its potential energy, until the second hooking portions 32 pass over the peaks of the slanted walls 2631. The elastic member 28 releases the potential energy to automatically drive the base member 26 to move in a direction opposite to the direction A, until the second hooking portions 32 hook with the first hooking portions 263. The latching portion 267 re-latches into the latching slot 133, further maintaining the hook of the second hooking portions 32 and the first hooking portions 263. The attachment of the bottom cover 30 to the housing 10 is completed.

To power on or off the portable electronic device, the main body 221 is pressed with external force along a direction along B (shown in FIG. 3) to move the switching portion 223 further into the housing 10, until the switching portion 223 resists against the switch 52. The portable electronic device is switched to power on or off.

It is to be understood that even though numerous characteristics and advantages of the present embodiments have been set forth in the foregoing description, together with details of assemblies and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A multi-functional switch assembly for a portable electronic device, the portable electronic device comprising a bottom cover, a housing and a circuit board, the circuit board having an electronic switch, the multi-functional switch assembly comprising: a base member defining a through slit and a latching portion latched to the housing, and hooking portions hooking to the bottom cover; a driving member assembled to the base member and comprising a press portion and a switching portion opposite to the press portion, the switching portion extending through the through slit and aligned with the electronic switch for resisting against and switching the electronic switch when pressing the press portion; and a switching member comprising a handle portion and a resisting portion opposite to the handle portion, the resisting portion resisting against and for moving the base member to release the latching of the latching portion and the housing and the hooking of the hooking portions and the bottom cover.

2. The multi-functional switch assembly as claimed in claim 1, further comprising a post, the switching member further comprises a main portion between the handle portion and the resisting portion, and a coil portion formed on the main portion, the coil portion securing with the post.

3. The multi-functional switch assembly as claimed in claim 1, wherein the base member further comprises a column, the driving member comprising an arm, the arm forming a ring securing with the column.

4. The multi-functional switch assembly as claimed in claim 3, further comprising:
a pin and an elastic member; and
the base member further comprises a securing portion, the elastic member having two opposite ends securing with the securing portion and the pin, respectively.

5. The multi-functional switch assembly as claimed in claim 4, wherein the base member further comprises an elastic bar, the latching portion formed a distal end of the elastic bar, the housing defining a latching slot latching the latching portion therein.

6. A multi-functional switch assembly for a portable electronic device, the portable electronic device comprising a cover, a housing and an electronic switch assembled on a circuit board, the multi-functional switch assembly comprising: a base member assembled to the housing; a driving member assembled to the base member, the driving member driven to switch on or off the electronic switch of the portable electronic device; a switching member assembled to the base member, the switching member switched between a first state where the base member is secured to the cover, and a second state where the cover can be detached from the base member; and an elastic member assembled to the base member and the housing, the elastic member providing potential energy to enable the base member slid ably relative to the housing between the first state and the second state; and the base member defines a through slit and a latching portion latched to the housing, and hooking portions hooking to the cover; the driving member comprising a switching portion extending through the through slit and aligned with the electronic switch for resisting against and switching the electronic switch.

7. The multi-functional switch assembly as claimed in claim 6, wherein the driving member is driven along a direction substantially perpendicularly to the switching of the switching member.

8. The multi-functional switch assembly as claimed in claim 6, wherein the base member is latched to the housing at the first state and the second state, the switching member switched to release the latching of the base member and the housing.

9. The multi-functional switch assembly as claimed in claim 6, wherein the driving member comprises a press portion opposite to the a switching portion, the press portion pressed towards the switch when the driving member driven.

10. The multi-functional switch assembly as claimed in claim 6, wherein the switching member comprises a handle portion and a resisting portion opposite to the handle portion, the resisting portion resisting against and moving the base member to release the latching of the latching portion and the housing and the hooking of the hooking portions and the cover.

11. The multi-functional switch assembly as claimed in claim 10, further comprising a post, the switching member further comprises a main portion between the handle portion and the resisting portion, and a coil portion formed on the main portion, the coil portion securing with the post.

12. The multi-functional switch assembly as claimed in claim 10, wherein the base member further comprises a column, the driving member comprising an arm, the arm forming a ring securing with the column.

13. The multi-functional switch assembly as claimed in claim 12, further comprising a pin, the base member further comprises a securing portion, the elastic member having two opposite ends securing with the securing portion and the pin, respectively.

14. The multi-functional switch assembly as claimed in claim 13, wherein the base member further comprises an elastic bar, the latching portion formed a distal end of the elastic bar, the housing defining a latching slot latching the latching portion therein.

15. A portable electronic device, comprising: a housing; a cover mating with housing; and a switch assembled with the housing; a multi-functional switch assembly comprising: a base member assembled to the housing; a driving member assembled to the base member, the driving member driven to switch on or off an electronic switch assembled on a circuit board; a switching member assembled to the base member, the switching member switched between a first state where the base member secured to the cover, and a second state where the cover detached from the base member; and an elastic member assembled to the base member and the housing, the elastic member providing potential energy to enable the base member slidably relative to the housing between the first state and the second state; and the base member defines a through slit and a latching portion latched to the housing, and hooking portions hooking to the cover; the driving member comprising a switching portion extending through the through slit and aligned with the electronic switch for resisting against and switching the electronic switch.

16. The portable electronic device as claimed in claim 15, wherein the driving member is driven along a direction substantially perpendicularly to the switching of the switching member.

17. The portable electronic device as claimed in claim 15, wherein the base member is latched to the housing at the first state and the second state, the switching member switched to release the latching of the base member and the housing.

* * * * *